(12) United States Patent
Chao et al.

(10) Patent No.: US 10,826,449 B2
(45) Date of Patent: Nov. 3, 2020

(54) BIAS SWITCH CIRCUIT FOR COMPENSATING FRONTEND OFFSET OF HIGH ACCURACY MEASUREMENT CIRCUIT

(71) Applicant: HYCON TECHNOLOGY CORP., Taipei (TW)

(72) Inventors: Po-Yin Chao, Taipei (TW); Hung-Wei Chen, Taipei (TW); Shui-Chu Lee, Taipei (TW)

(73) Assignee: HYCON TECHNOLOGY CORP., Taipei (TW)

( * ) Notice: Subject to any disclaimer, the term of this patent is extended or adjusted under 35 U.S.C. 154(b) by 116 days.

(21) Appl. No.: 16/249,138

(22) Filed: Jan. 16, 2019

(65) Prior Publication Data

US 2020/0186109 A1 Jun. 11, 2020

(30) Foreign Application Priority Data

Dec. 5, 2018 (TW) .................................. 107143758

(51) Int. Cl.
*H03F 3/45* (2006.01)
*G01R 19/00* (2006.01)
*H03F 1/30* (2006.01)
*H03F 3/393* (2006.01)

(52) U.S. Cl.
CPC ..... *H03F 3/45753* (2013.01); *G01R 19/0053* (2013.01); *H03F 1/301* (2013.01); *H03F 3/393* (2013.01); *H03F 3/45179* (2013.01)

(58) Field of Classification Search
CPC ........................... H03F 3/457; G01R 19/0053
See application file for complete search history.

(56) References Cited

U.S. PATENT DOCUMENTS

| 8,198,937 B1 * | 6/2012 | Vilas Boas | H03F 3/45475 330/9 |
| 8,265,769 B2 * | 9/2012 | Denison | A61N 1/3702 607/60 |
| 2007/0120595 A1 * | 5/2007 | Udupa | H03F 3/45479 330/9 |
| 2008/0191713 A1 * | 8/2008 | Hauer | H03M 3/496 324/658 |
| 2013/0293294 A1 | 11/2013 | Lyden et al. | |
| 2014/0375374 A1 * | 12/2014 | Nervegna | H03M 3/464 327/337 |

(Continued)

*Primary Examiner* — Patricia T Nguyen
(74) *Attorney, Agent, or Firm* — Demian K. Jackson; Jackson IPG PLLC

(57) ABSTRACT

Disclosed is a high accurate measurement circuit, and the feature is using bias switching circuit for compensating front end offset, and the back end offset of amplifier is also cancelled. In the real measurement environment, offset exists in the amplifier of the measurement circuit has, and non-ideal effects also exist in the interface between measurement terminal and the measurement circuit, such as leakage current of chip package pins or mismatch of the circuit. The above non-ideal effects belong to front end offset and cannot be compensated by the prior arts. The disclosed structure uses the bias switch circuit and uses different switching method in the two measurement timings. By subtracting the measurement results for the two measurement timings, the front end offset is compensated, and the back end offset of the amplifier is also cancelled.

22 Claims, 11 Drawing Sheets

(56) References Cited

U.S. PATENT DOCUMENTS

| | | |
|---|---|---|
| 2016/0070381 A1 | 3/2016 | Park et al. |
| 2017/0146633 A1* | 5/2017 | Das ................. G01R 35/005 |
| 2018/0198417 A1 | 7/2018 | Vijaykumar et al. |

* cited by examiner

US 10,826,449 B2

BIAS SWITCH CIRCUIT FOR COMPENSATING FRONTEND OFFSET OF HIGH ACCURACY MEASUREMENT CIRCUIT

FIELD OF THE INVENTION

The present invention relates to a high accurate measurement circuit. More particularly, the present invention relates to a measurement circuit utilizing a bias switching circuit to compensate offset of the front end circuit, further increasing accuracy of measurement.

BACKGROUND OF THE INVENTION

Circuits to measure voltage or current are widely used in various electronic components. They usually use low noise amplifiers and analog-to-digital converters to convert voltage or current into digital output. However, there are some non-ideal effects in the measurement circuit. For example, leakage current of the components and offsets of low noise amplifiers and analog-to-digital converters all affect the accuracy of measurements.

Taiwan patent no. 1543544 discloses an architecture comprising a plurality of capacitor pairs and a plurality of switches, and an operation method utilizing switches to transfer electric charges to eliminate gain errors of the amplifier.

As shown in FIG. 1, in U.S. Pat. No. 9,912,309, a chopper is connected to a front end of an amplifier. The differential input signal can be directly connected or interchangeably connected to the back end amplifier. Output voltages for the two connecting methods are measured, respectively. Subtracting the two measurement results can eliminate the offset of the amplifier.

In US patent publication no. 20180301174, an amplified circuit architecture for detecting currents is disclosed. Current to be measured passes through a resistor, and the other terminal of the resistor connects to a fixed voltage source. A differential input voltage generated from two terminals of the resistor passes through a chopper, and directly connects or interchangeably connects to the amplifier in the back end. Output voltages for the two connecting methods are measured, respectively. Subtracting results from the measurements can eliminate the offset caused by the amplifier.

In addition, FIG. 2 shows another conventional measurement circuit architecture with front end offset and amplifier offset. An amplifier offset 703 is eliminated by a chopper 702. However, leakage current generated by an electrostatic protection circuit 701 in the front end of the chopper 702 cannot be compensated. Effects of the above prior arts are to eliminate the amplifier offsets, which are the offsets in the back end of the switch circuit or the chopper. But in the actual measurement environment, there are non-ideal effects in the circuit between the measurement terminal and inside of the chip. For example, if there are leakage currents in the package pins of a chip or differential circuits at both ends do not match, it will also cause an offset. Said offsets belong to the switch circuit or the chopper in the front end can not be eliminated by current techniques.

SUMMARY OF THE INVENTION

The present invention provides an accurate measurement circuit utilizing a switching circuit to compensate offsets in the front end. The accurate measurement circuit comprises an amplifier and two switches, wherein a positive input of amplifier is connected to a measurement terminal via a positive terminal pin, a negative input of amplifier is connected to the measurement terminal via a negative terminal pin, and an output signal is generated according to a voltage difference between the positive input of amplifier and the negative input of amplifier. The first switch is connected between the positive input of amplifier and a reference voltage. The second switch is connected between the negative input of amplifier and the reference voltage.

An operation method of said accurate measurement circuit comprises two timings: a first timing and a second timing. The first timing conducts the first switch, turns off the second switch, and hence the positive input of amplifier is connected to the reference voltage. At this moment, voltage of the positive input of amplifier equals to the reference voltage ($V_{REF}$). Voltage of the negative input of amplifier equals to the reference voltage ($V_{REF}$) subtracted by "current to be measured ($I_S$) subtracted by a leakage current of negative terminal pin ($I_{L2}$), and multiplied by an input impedance ($R_S$)". Mathematical expression is "$V_{REF}-((I_S-I_{L2})*R_S)$". A voltage difference between the positive input of amplifier and the negative input of amplifier is "$(I_S-I_{L2})*R_S$". The second timing conducts the second switch, turns off the first switch, and hence the negative input of amplifier is connected to the reference voltage. At this moment, voltage of the negative input of amplifier equals to the reference voltage ($V_{REF}$). Voltage of the positive input of amplifier equals to the reference voltage ($V_{REF}$) added by "current to be measured ($I_S$) added by a leakage current of positive terminal pin ($I_{L1}$), and multiplied by an input impedance ($R_S$)". Mathematical expression is $V_{REF}+((I_S+I_{L1})*R_S)$. A voltage difference between the positive input of amplifier and the negative input of amplifier is "$(I_S+I_{L1})*R_S$". Assuming the gain of the amplifier is K, the output voltages generated by the two timings are added and then divided by 2 is $K*(I_S+((I_{L1}-I_{L2})/2))*R_S$. Thus, non-ideal effect of the leakage current of positive terminal pin ($I_{L1}$) and the leakage current of negative terminal pin ($I_{L2}$) can be compensated.

The above operation method compensates the offset belongs to the front end circuit and solved the problems which cannot be handled in the prior arts. If the leakage current of positive terminal pin ($I_{L1}$) and the leakage current of negative terminal pin ($I_{L2}$) are exactly matched, the offset in the front end can be completely cancelled off. If they are not exactly matched, a partially cancelled off effect can also be available.

In the above operation method, the higher the input impedance ($R_S$) is, the better the compensation effect is for the leakage current ($I_{L1}$ and $I_{L2}$). The reason is during the first timing, when conducting first switch, ideal situation is the leakage current of positive terminal pin ($I_{L1}$) flowing to the reference voltage instead of the input impedance ($R_S$). The higher input impedance ($R_S$) is, the closer it comes to the ideal situation. During the second timing when conducting second switch, ideal situation is the leakage current of negative terminal pin ($I_{L2}$) flowing to the reference voltage instead of the input impedance ($R_S$). The higher input impedance ($R_S$) is, the closer it comes to the ideal situation. Thus, the higher the input impedance ($R_S$) is, the better the compensation effect is for the leakage current ($I_{L1}$ and $I_{L2}$).

In the above accurate measurement circuit and the operation method, there is a compensation effect for the leakage current of front end pin but the offset of the amplifier is not eliminated. It is just to adjust the connection of the switches to compensate the leakage current of front end pin and eliminate the offset of the back end amplifier at the same time.

The present invention provides another accurate measurement circuit utilizing a switching circuit for compensating the offset in the front end. The accurate measurement circuit comprises an amplifier and six switches. The amplifier generates an output signal according to a voltage difference between a positive input of amplifier and a negative input of amplifier. One terminal of a first switch and one terminal of a second switch are both connected to a reference voltage. Other terminals are connected to a measurement terminal via a positive terminal pin and a negative terminal pin, respectively. A third switch is connected between the positive terminal pin and the positive input of amplifier. A fourth switch is connected between the positive terminal pin and the negative input of amplifier. A fifth switch is connected between the negative terminal pin and the positive input of amplifier. A sixth switch is connected between the negative terminal pin and the negative input of amplifier.

An operation method of said accurate measurement circuit comprises two timings: a first timing and a second timing. In the first timing, conduct the first switch, the third switch and the sixth switch, turn off the second switch, the fourth switch and the fifth switch. Hence, the positive terminal pin and the positive input of amplifier are connected to the reference voltage, and the negative terminal pin is connected to the negative input of amplifier at the same time. At this moment, voltage of the positive input of amplifier equals to the reference voltage ($V_{REF}$) added by an offset voltage ($V_{OS}$) of the amplifier. Mathematical expression is "$V_{REF}+V_{OS}$". Voltage of the negative input of amplifier equals to the reference voltage ($V_{REF}$) subtracted by "current to be measured ($I_S$) subtracted by a leakage current of negative terminal pin ($I_{L2}$), multiplied by an input impedance ($R_S$)". Mathematical expression is "$V_{REF}-((I_S-I_{L2})*R_S)$". Thus, a voltage difference between the positive input of amplifier and the negative input of amplifier is "$V_{OS}+(I_S-I_{L2})*R_S$". In the second timing, conduct the second switch, the fourth switch and the fifth switch, and turn off the first switch, the third switch and the sixth switch. Hence, the negative terminal pin and the positive input of amplifier are connected to the reference voltage, and the positive terminal pin is connected to the negative input of amplifier at the same time. At this moment, voltage of the positive input of amplifier equals to the reference voltage ($V_{REF}$) added by the offset voltage ($V_{OS}$) of the amplifier. Mathematical expression is "$V_{REF}+V_{OS}$". Voltage of the negative input of amplifier equals to the reference voltage ($V_{REF}$) added by "current to be measured ($I_S$) added by a leakage current of positive terminal pin ($I_{L1}$), and multiplied by an input impedance ($R_S$)". Mathematical expression is "$V_{REF}+((I_S+I_{L1})*R_S)$". Thus, a voltage difference between the positive input of amplifier and the negative input of amplifier is "$V_{OS}-(I_S+I_{L1})*R_S$". Assuming the gain of the amplifier is K, the output voltages generated in the two timings are subtracted and then divided by 2 is "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, the offset voltage ($V_{OS}$) of the amplifier can be completely eliminated.

The present invention provides another accurate measurement circuit utilizing a switching circuit compensating the offset in the front end. The accurate measurement circuit comprises an amplifier and four switches. The amplifier generates an output signal according to a voltage difference between the positive input of amplifier and the negative input of amplifier. A reference voltage is directly connected to the positive input of amplifier or the negative input of amplifier. A first switch is connected between a positive terminal pin and the positive input of amplifier. A second switch is connected between the positive terminal pin and the negative input of amplifier. A third switch is connected between a negative terminal pin and the positive input of amplifier. A fourth switch is connected between the negative terminal pin and the negative input of amplifier. The positive terminal pin and the negative terminal pin are used to connect to a measurement terminal.

An operation method of said accurate measurement circuit comprises two timings: a first timing and a second timing. The reference voltage of these two timings is fixedly connected to the positive input of amplifier or the negative input of amplifier. In the first timing, conduct the first switch and the fourth switch, and turn off the second switch and the third switch. Hence, the positive terminal pin is connected to the positive input of amplifier, and the negative terminal pin is connected to the negative input of amplifier at the same time. Evaluate a condition according to that the reference voltage is connected to the positive input of amplifier, a voltage difference between the positive input of amplifier and the negative input of amplifier is "$V_{OS}-(I_S-I_{L2})*R_S$". In the second timing, conduct the second switch and the third switch, and turn off the first switch and the fourth switch. Hence, the positive terminal pin is connected to the negative input of amplifier, and the negative terminal pin is connected to the positive input of amplifier at the same time. Evaluate a condition according to that the reference voltage is connected to the positive input of amplifier, a voltage difference between the positive input of amplifier and the negative input of amplifier is "$V_{OS}-(I_S+I_{L1})*R_S$". Assuming the gain of the amplifier is K, the output voltages generated in the two timings are subtracted and then divided by 2 is "$K*(I_S+(I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, the offset voltage ($V_{OS}$) of the amplifier can be completely eliminated.

For the accurate measurement circuits mentioned above, voltage of the output of amplifier equals to a voltage difference between the positive input of amplifier and the negative input of amplifier, and multiplied by a gain (K). Mathematical expression is "$V_{OUT+}=K*(V_{IN+}-V_{IN-})$". The amplifier may further comprise a negative output of amplifier. A voltage difference between the output of amplifier and the negative output of amplifier equals to that between the positive input of amplifier and the negative input of amplifier, multiplied by a gain (K). Mathematical expression is "$V_{OUT+}-V_{OUT-}=K*(V_{IN+}-V_{IN-})$".

The present invention provides another accurate measurement circuit utilizing a switching circuit for compensating the offset in the front end. The accurate measurement circuit comprises an amplifier and four switches. The amplifier generates an output signal according to the voltage of the positive input of amplifier. A first switch is connected between a positive terminal pin and the positive input of amplifier. A second switch is connected between the positive terminal pin and a reference voltage. A third switch connected between a negative terminal pin and the positive input of amplifier. A fourth switch connected between the negative terminal pin and the reference voltage. The positive terminal pin and the negative terminal pin are used to connect to the measurement terminal.

An operation method of said accurate measurement circuit comprises two timings: a first timing and a second timing. In the first timing, conduct the first switch and the fourth switch, and turn off the second switch and the third switch. Hence, the positive terminal pin is connected to the positive input of amplifier, and the negative terminal pin is connected to the reference voltage. Thus, the voltage of the positive input of amplifier is "$V_{REF}+V_{OS}+(I_S+I_{L1})*R_S$". In the second timing, conduct the second switch and the third switch, and turn off the first switch and the fourth switch. Hence, the positive terminal pin is connected to the reference voltage, and the negative terminal pin is connected to the positive input of amplifier. Thus, the voltage of the positive input of amplifier is "$V_{REF}+V_{OS}-(I_S-I_{L2})*R_S$". Assuming the gain of the amplifier is K, the output voltages generated in the two timings are subtracted and then divided by 2 is "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, the offset voltage ($V_{OS}$) of the amplifier can be completely eliminated.

In the above operation method, if the leakage current of positive terminal pin ($I_{L1}$) and the leakage current of negative terminal pin ($I_{L2}$) are exactly matched, the offset in the front end can be completely cancelled off. If they are not exactly matched, a partially cancelled off effect can also be available.

In the operation method mentioned above, the higher the input impedance ($R_S$) is, the better the compensation effect is for the leakage current ($I_{L1}$ and $I_{L2}$). The reason is during the first timing, when conducting first switch, ideal situation is the leakage current of positive terminal pin ($I_{L1}$) flowing to the reference voltage instead of the input impedance ($R_S$). The higher input impedance ($R_S$) is, the closer it comes to the ideal situation. During the second timing when conducting second switch, ideal situation is the leakage current of negative terminal pin ($I_{L2}$) flowing to the reference voltage instead of the input impedance ($R_S$). The higher input impedance ($R_S$) is, the closer it comes to the ideal situation. Thus, the higher the input impedance ($R_S$) is, the better the compensation effect is for the leakage current ($I_{L1}$ and $I_{L2}$).

This paragraph extracts and compiles some features of the present invention; other features will be disclosed in the follow-up paragraphs. It is intended to cover various modifications and similar arrangements included within the spirit and scope of the appended claims.

DETAILED DESCRIPTION OF THE PREFERRED EMBODIMENTS

The present invention will now be described more specifically with reference to the following embodiments. Please note that the following description of embodiments of the invention is intended to be merely illustrative. This is not meant to be an exhaustive description of the invention or limited to the form of the disclosure.

Figure 1:
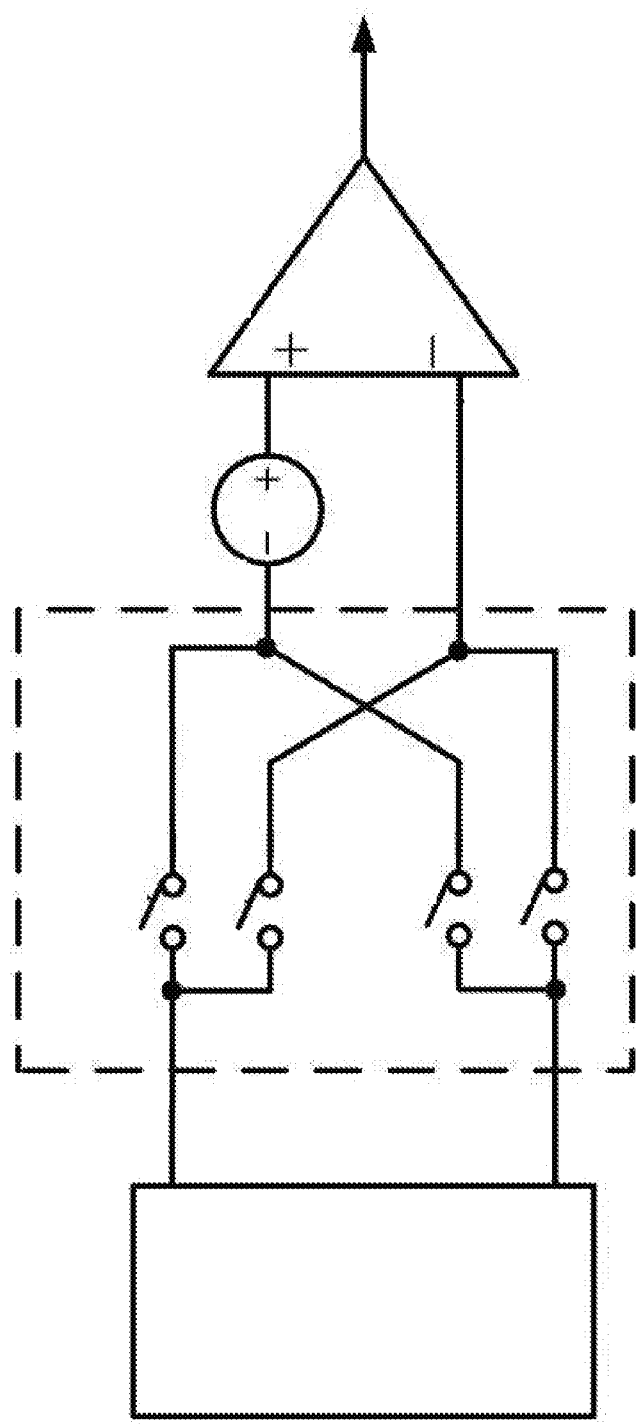
FIG. 1 illustrates a conventional architecture using a chopper to eliminate the amplifier offset.
Figure 2:
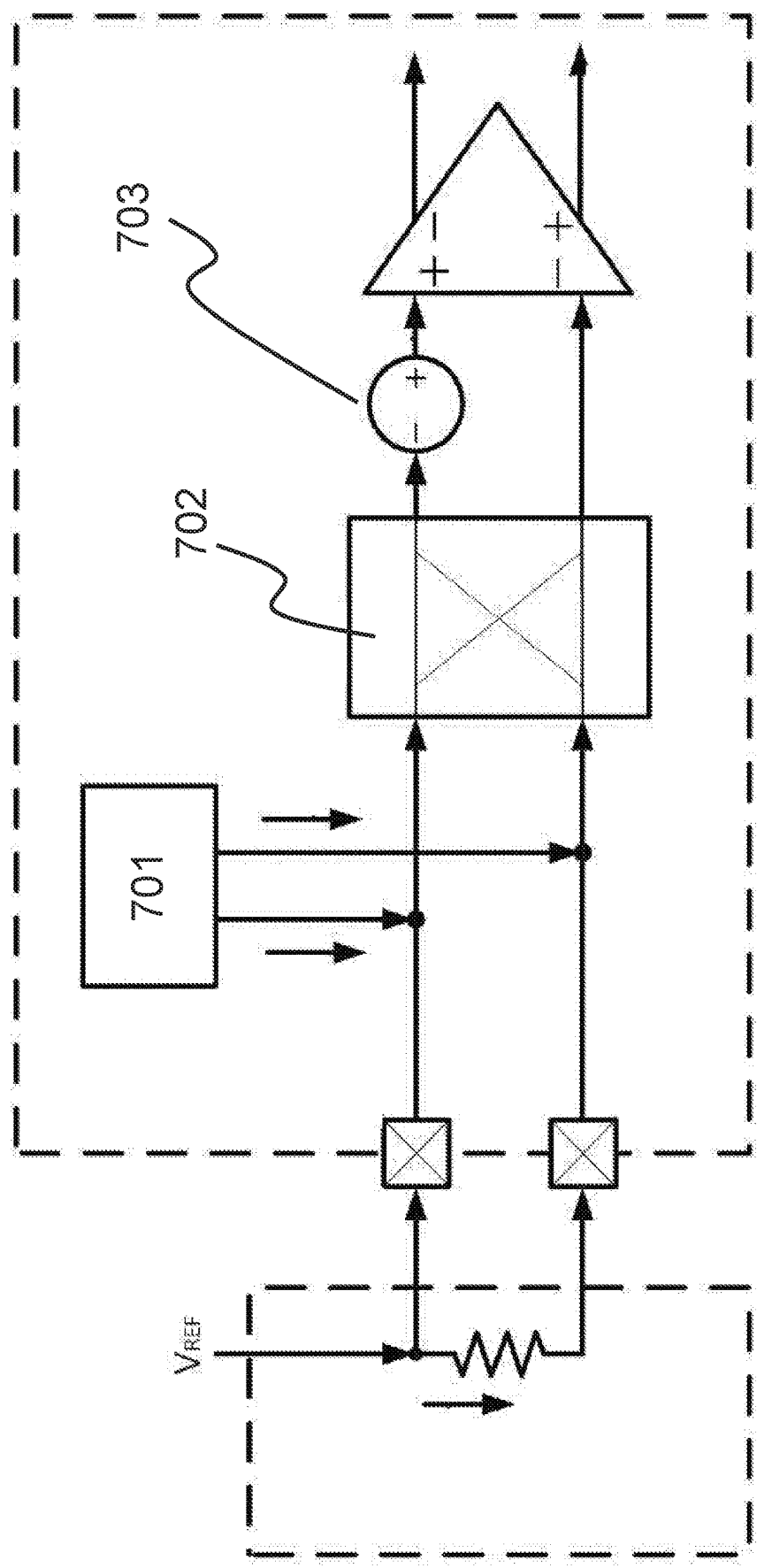
FIG. 2 illustrates a conventional measurement circuit architecture having front end offset and amplifier offset.
Figure 3:
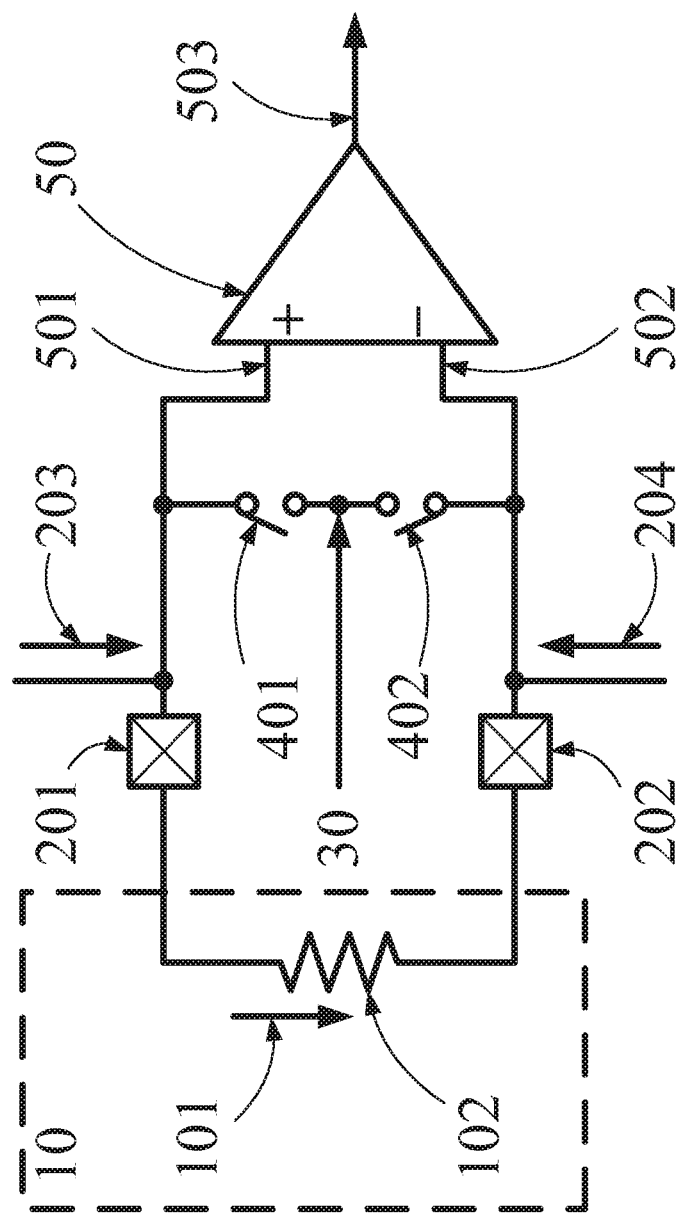
FIG. 3 illustrates a switching circuit architecture compensating the offset of a front end according to a first embodiment of the present invention.

A first embodiment of the present invention is disclosed in FIG. 3. It shows an accurate measurement circuit utilizing a switching circuit for compensating the offset in the front end. The accurate measurement circuit comprises an amplifier 50 and two switches. One terminal of a first switch 401 is connected to a positive input of amplifier 501, and the other terminal is connected to a reference voltage 30. One terminal of a second switch 402 is connected to a negative input of amplifier 502, and the other terminal is connected to the reference voltage 30. The positive input of amplifier 501 and the negative input of amplifier 502 are connected to a measurement terminal 10 via a positive terminal pin 201 and a negative terminal pin 202, respectively.

Figure 4B:
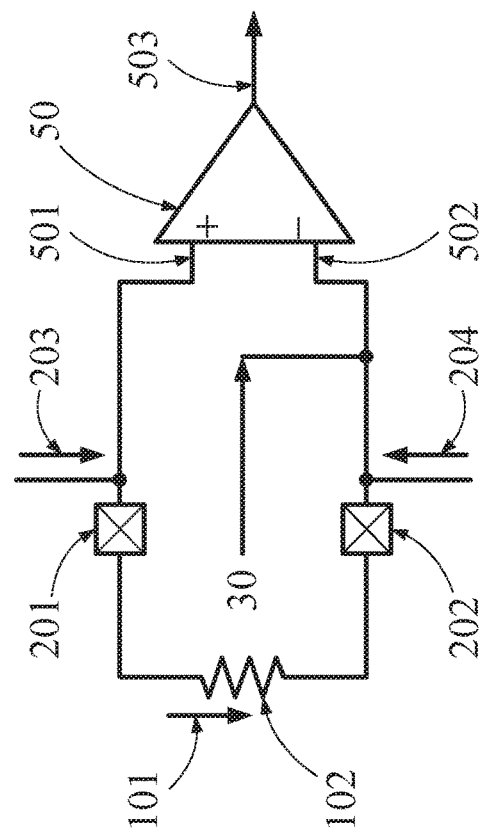
FIG. 4A and FIG. 4B illustrate an operation method for the switching circuit compensating the offset in the front end in FIG. 3.
Figure 4A:
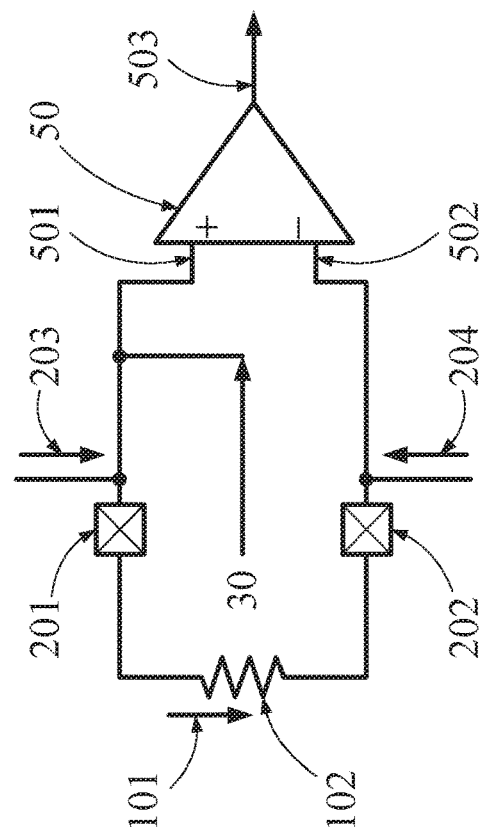

An operation method of above accurate measurement circuit comprises two timings: a first timing and a second timing. In the first timing, conduct the first switch 401, and turn off the second switch 402. Hence, the positive input of amplifier 501 is connected to the reference voltage 30. An equivalent circuit diagram is shown in FIG. 4A. At this moment, the voltage of the positive input of amplifier 501 equals to the reference voltage 30 ($V_{REF}$). The voltage of the negative input of amplifier 502 equals to the reference voltage 30 ($V_{REF}$) subtracted by "current to be measured 101 ($I_S$) subtracted by a leakage current of negative terminal pin 204 ($I_{L2}$), and multiplied by an input impedance 102 ($R_S$)". Mathematical expression is "$V_{REF}-((I_S-I_{L2})*R_S)$". A voltage difference between the positive input of amplifier 501 and the negative input of amplifier 502 is "$(I_S-I_{L2})*R_S$". In the second timing, conduct the second switch 402, and turn off the first switch 401. Hence, the negative input of amplifier 502 is connected to the reference voltage 30. An equivalent circuit diagram is shown in FIG. 4B. At this moment, the voltage of the negative input of amplifier 502 equals to the reference voltage 30 ($V_{REF}$). The voltage of the positive input of amplifier 501 equals to the reference voltage 30 ($V_{REF}$) added by "current to be measured 101 ($I_S$) added by a leakage current of positive terminal pin 203 ($I_{L1}$), and multiplied by input impedance 102 ($R_S$)". Mathematical expression is "$V_{REF}+((I_S+I_{L1})*R_S)$". A voltage difference between the positive input of amplifier 501 and the negative input of amplifier 502 is "$(I_S+I_{L1})*R_S$". Assuming the gain of the amplifier 50 is K, an output voltage $V_{OUT1}$ output by the output of amplifier 503 in FIG. 4A is $$V_{OUT1} = K*(V+ - V-)$$
$$= K*(V_{REF} - (V_{REF} - (I_S - I_{L2})*R_S))$$
$$= K*(I_S - I_{L2})*R_S$$

An output voltage $V_{OUT2}$ output by the output of amplifier 503 in FIG. 4B is:

$$V_{OUT2} = K*(V+ - V-)$$
$$= K*((V_{REF} + (I_S + I_{L1})*R_S) - V_{REF})$$
$$= K*(I_S + I_{L1})*R_S$$

Output voltages $V_{OUT1}$ and $V_{OUT2}$ generated in the two timings are added and then divided by 2 to get "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated.

In the above operation method, the higher the input impedance 102 ($R_S$) is, the better the compensation effect of the leakage current ($I_{L1}$ and $I_{L2}$) is. The reason is during the first timing when conducting the first switch 401, ideal situation is the leakage current of positive terminal pin 203 ($I_{L1}$) flowing to the reference voltage 30 but not to the input impedance 102 ($R_S$). Increasing the resistance of the input impedance 102 ($R_S$) will let the leakage current of positive terminal pin 203 ($I_{L1}$) less easy to flow to the input impedance 102 ($R_S$). It comes closer to the ideal situation. During the second timing when conducting the second switch 402, ideal situation is the leakage current of negative terminal pin 204 ($I_{L2}$) flowing to the reference voltage 30 but not to the input impedance 102 ($R_S$). Similarly, higher input resistance of the impedance 102 ($R_S$) is closer to the ideal situation. Hence, the higher the input impedance 102 ($R_S$) is, the better the compensation effect is for the leakage current ($I_{L1}$ and $I_{L2}$).

In the above accurate measurement circuit and the operation method, there is a compensation effect for the leakage current of positive terminal pin 203 ($I_{L1}$) and the leakage current of negative terminal pin 204 ($I_{L2}$) but the offset of the amplifier 50 is not eliminated. It is just to adjust the connection of the switches to compensate the leakage current of front end pin and eliminate the offset of the back end amplifier at the same time.

Figure 5:
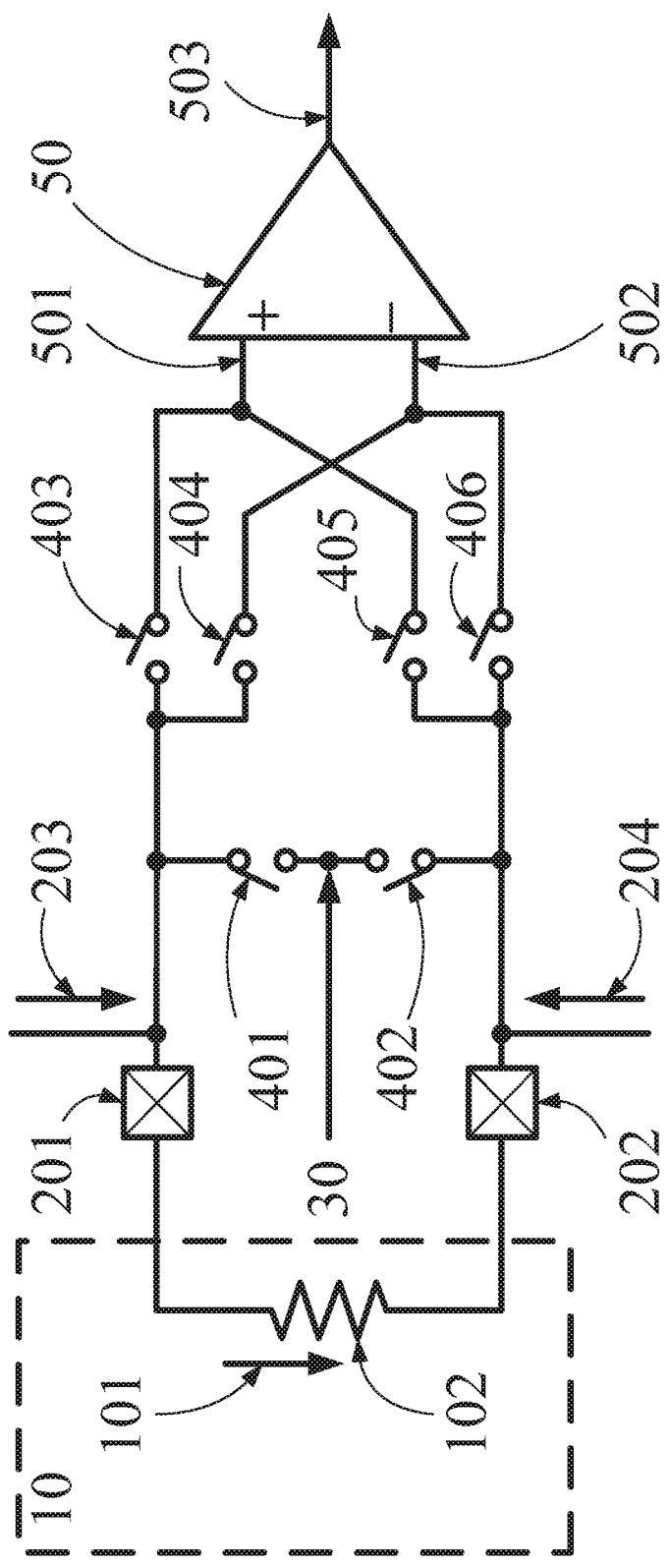
FIG. 5 illustrates a switching circuit architecture compensating the offset in the front end and eliminating the offset of the amplifier according to a second embodiment of the present invention.

A second embodiment of the present invention is disclosed in FIG. 5. It shows a switching circuit architecture compensating the offset in the front end and eliminating the offset of the amplifier. The accurate measurement circuit comprises an amplifier 50 and six switches. A first switch 401 is connected between a reference voltage 30 and a positive terminal pin 201. A second switch 402 is connected between the reference voltage 30 and a negative terminal pin 202. A third switch 403 is connected between the positive terminal pin 201 and a positive input of amplifier 501. A fourth switch 404 is connected between the positive terminal pin 201 and a negative input of amplifier 502. A fifth switch 405 is connected between the negative terminal pin 202 and the positive input of amplifier 501. A sixth switch 406 is connected between the negative terminal pin 202 and the negative input of amplifier 502.

Figure 6B:
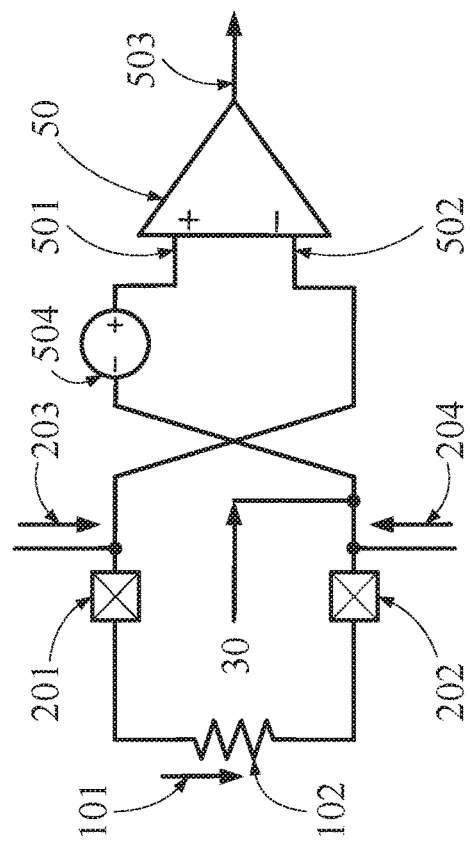
FIG. 6A and FIG. 6B illustrate an operation method for the switching circuit compensating the offset in the front end and eliminating the offset of the amplifier in FIG. 5.
Figure 6A:
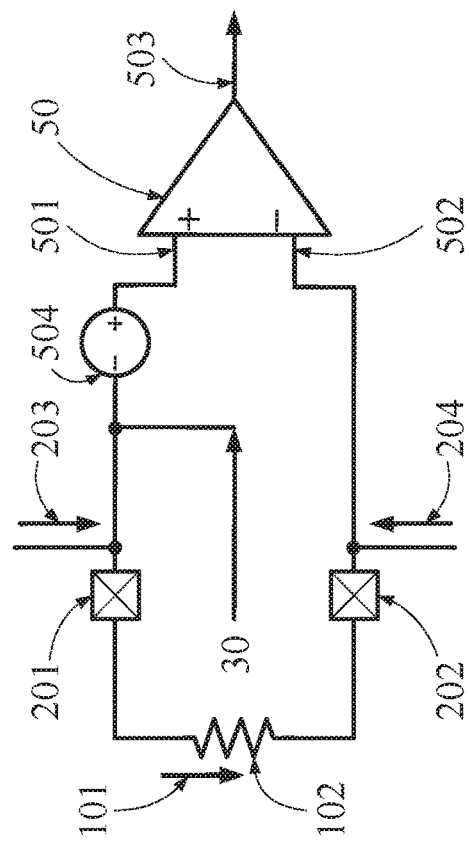

An operation method of above accurate measurement circuit comprises two timings: a first timing and a second timing. In the first timing, conduct the first switch 401, the third switch 403 and the sixth switch 406, and turn off the second switch 402, the fourth switch 404 and the fifth switch 405. Hence, the positive terminal pin 201 and the positive input of amplifier 501 are connected to the reference voltage 30, and the negative terminal pin 202 is connected to the negative input of amplifier 502 at the same time. An equivalent circuit diagram is shown in FIG. 6A. At this moment, the voltage of the positive input of amplifier 501 equals to the reference voltage 30 ($V_{REF}$) added by an amplifier offset voltage 504 ($V_{OS}$). Mathematical expression is "$V_{REF}+V_{OS}$". The voltage of the negative input of amplifier 502 equals to the reference voltage 30 ($V_{REF}$) subtracted by "current to be measured 101 ($I_S$) subtracted by a leakage current of negative terminal pin 204 ($I_{L2}$), and multiplied by an input impedance 102 ($R_S$)". Mathematical expression is "$V_{REF}-((I_S-I_{L2})*R_S)$". Thus, a voltage difference between the positive input of amplifier 501 and the negative input of amplifier 502 is "$V_{OS}+(I_S-I_{L2})*R_S$". In the second timing, conduct the second switch 402, the fourth switch 404 and the fifth switch 405, and turn off the first switch 401, the third switch 403 and the sixth switch 406. Hence, the negative terminal pin 202 and the positive input of amplifier 501 are connected to the reference voltage 30, and the positive terminal pin 201 is connected to the negative input of amplifier 502 at the same time. An equivalent circuit diagram is shown in FIG. 6B. At this moment, the voltage of the positive input of amplifier 501 equals to the reference voltage 30 ($V_{REF}$) added by the offset voltage 504 ($V_{OS}$) of the amplifier. Mathematical expression is "$V_{REF}+V_{OS}$". The voltage of the negative input of amplifier 502 equals to the reference voltage 30 ($V_{REF}$) added by "current to be measured 101 ($I_S$) added by a leakage current of positive terminal pin 203 ($I_{L1}$), and multiplied by the input impedance 102 ($R_S$)". Mathematical expression is "$V_{REF}+((I_S+I_{L1})*R_S)$". Thus, a voltage difference between the positive input of amplifier 501 and the negative input of amplifier 502 has a mathematical expression of "$V_{OS}-(I_S-I_{L1})*R_S$". Assuming the gain of the amplifier 50 is K, an output voltage $V_{OUT1}$ output by the output of amplifier 503 in FIG. 6A is:

$$V_{OUT1} = K*(V+ - V-)$$
$$= K*((V_{REF} + V_{OS}) - (V_{REF} - (I_S - I_{L2})*R_S))$$

An output voltage $V_{OUT2}$ output by the output of amplifier 503 in FIG. 6B is:

$$V_{OUT2} = K*(V+ - V-)$$
$$= K*((V_{REF} + V_{OS}) - (V_{REF} + (I_S + I_{L1})*R_S))$$

Output voltages $V_{OUT1}$ and $V_{OUT2}$ generated in the two timings are subtracted and then divided by 2 to get "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, errors of the offset voltage 504 ($V_{OS}$) of the amplifier can be completely cancelled off.

Figure 7B:
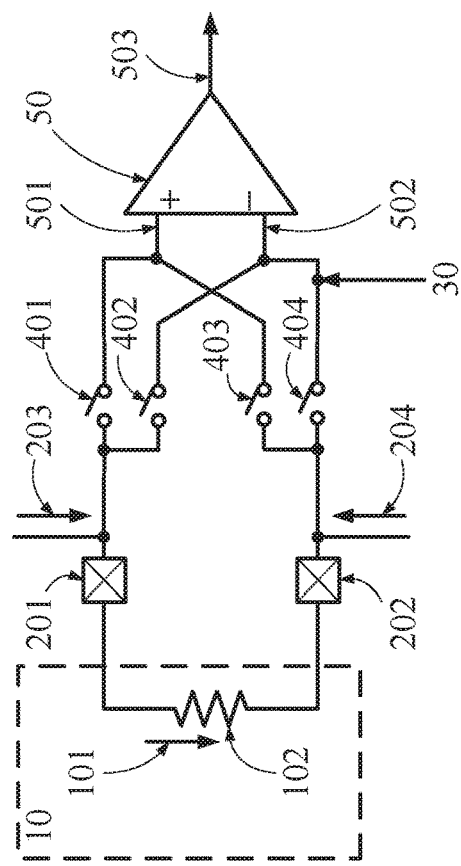
FIG. 7A and FIG. 7B illustrate another switching circuit architecture compensating the offset in the front end and eliminating the offset of the amplifier according to a third embodiment of the present invention.
Figure 7A:
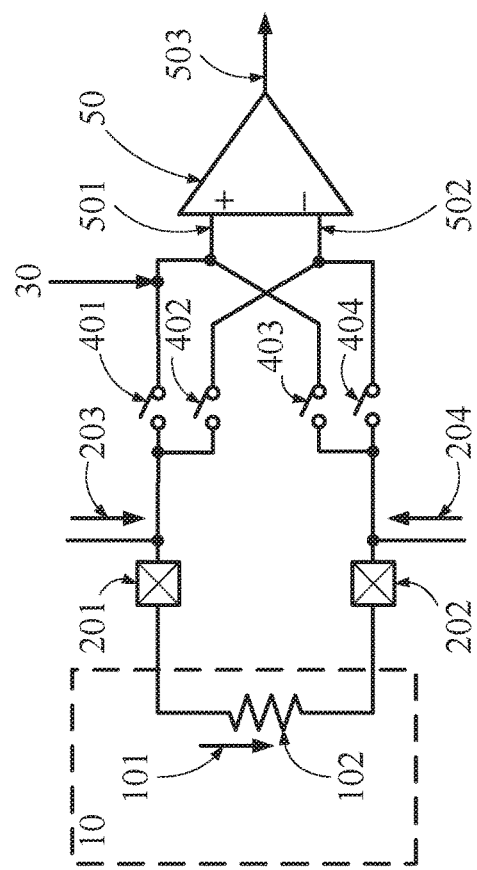

A third embodiment of the present invention is disclosed in FIG. 7. It shows another switching circuit architecture compensating the offset in the front end and eliminating offset of the amplifier. The accurate measurement circuit comprises an amplifier 50 and 4 switches. A first switch 401 is connected between a positive terminal pin 201 and a positive input of amplifier 501. A second switch 402 is connected between the positive terminal pin 201 and a negative input of amplifier 502. A third switch 403 is connected between a negative terminal pin 202 and the positive input of amplifier 501. A fourth switch 404 is connected between the negative terminal pin 202 and the negative input of amplifier 502. A reference voltage 30 is directly connected to the positive input of amplifier 501 (as shown in FIG. 7A) or the negative input of amplifier 502 (as shown in FIG. 7B). The positive terminal pin 201 and the negative terminal pin 202 are used to connect to a measurement terminal 10.

Figure 8B:
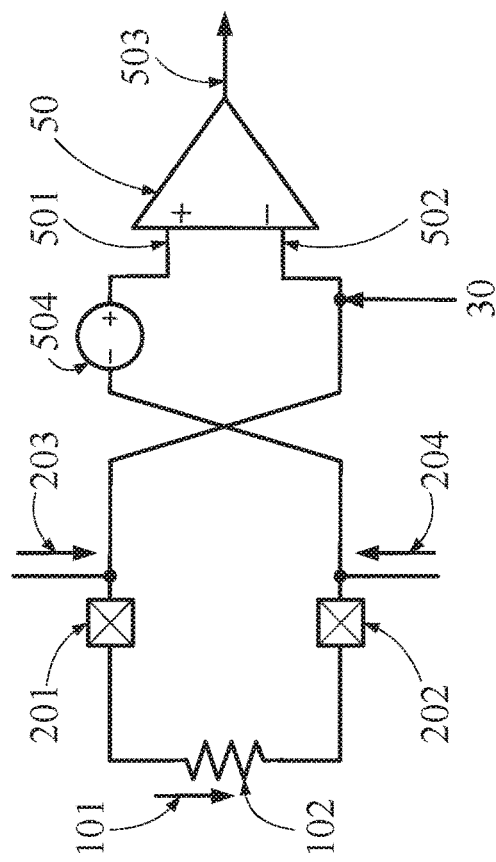
FIG. 8A and FIG. 8B illustrate an operation method for the switching circuit compensating the offset in the front end and eliminating the offset of the amplifier in FIG. 7B.
Figure 8A:
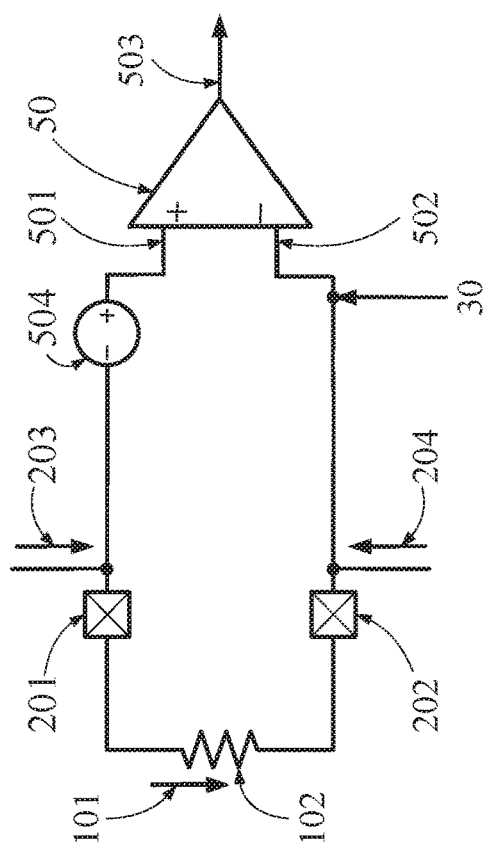

An operation method of above accurate measurement circuit comprises two timings. Please refer to FIG. 8. In FIG. 8, the reference voltage 30 is fixedly connected to the negative input of amplifier 502 in both the two timings. In a first timing, conduct the first switch 401 and the fourth switch 404, and turn off the second switch 402 and the third switch 403. Hence, the positive terminal pin 201 is connected to the positive input of amplifier 501, and the negative terminal pin 202 is connected to the negative input of amplifier 502 at the same time. An equivalent circuit diagram is shown in FIG. 8A. Thus, a voltage difference between the positive input of amplifier 501 and the negative input of amplifier 502 is the offset voltage ($V_{OS}$) of the amplifier added by "current to be measured 101 ($I_S$) added by the leakage current of positive terminal pin 203 ($I_{L1}$), and multiplied by an input impedance 102 ($R_S$)". Mathematical expression is "$V_{OS}-(I_S+I_{L1})*R_S$". In a second timing, conduct the second switch and the third switch, and turn off the first switch and the fourth switch. Hence, the positive terminal pin 201 is connected to the negative input of amplifier 502, and the negative terminal pin 202 is connected to the positive input of amplifier 501 at the same time. An equivalent circuit diagram is shown in FIG. 8B. Thus, a voltage difference between the positive input of amplifier 501 and the negative input of amplifier 502 is the amplifier offset voltage 504 ($V_{OS}$) subtracted by "current to be measured 101 ($I_S$) subtracted by a leakage current of negative terminal pin 204 ($I_{L2}$), and multiplied by an input impedance 102 ($R_S$)". Mathematical expression is "$V_{OS}-(I_S-I_{L2})*R_S$". Assuming the gain of the amplifier is K, an output voltage $V_{OUT1}$ output by the output of amplifier 503 in FIG. 8A is:

$$V_{OUT1} = K*(V+ - V-)$$
$$= K*(V_{OS} + (I_S + I_{L1})*R_S)$$

An output voltage $V_{OUT2}$ output by the output of amplifier 503 in FIG. 8B is:

$$V_{OUT2} = K*(V+ - V-)$$
$$= K*(V_{OS} - (I_S - I_{L2})*R_S)$$

Output voltages $V_{OUT1}$ and $V_{OUT2}$ generated in the two timings are subtracted and then divided by 2 to get "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, errors of the offset voltage 504 ($V_{OS}$) of the amplifier can be cancelled off.

Figure 10:
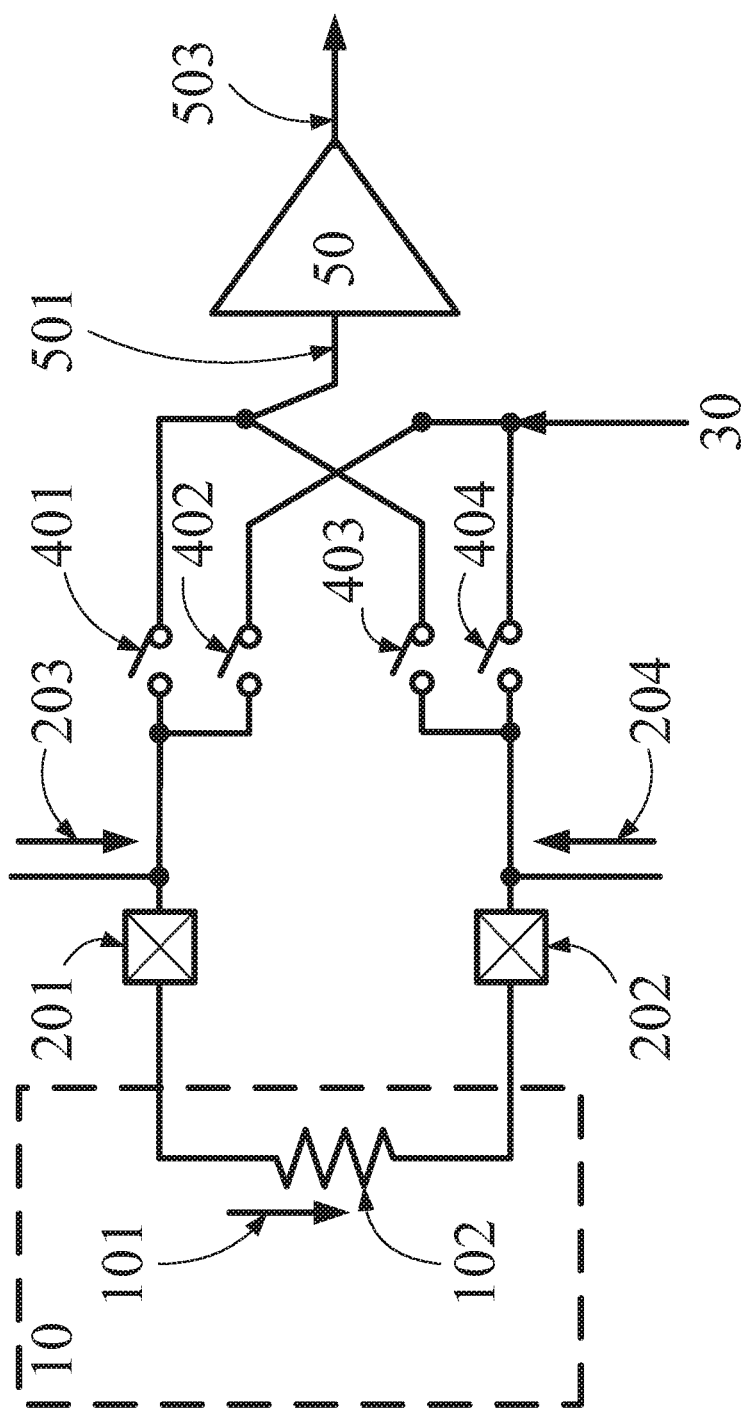
FIG. 10 illustrates another switching circuit architecture compensating the offset of the front end and eliminating the offset of amplifier according to a fourth embodiment of the present invention.

A fourth embodiment of the present invention is disclosed in FIG. 10. It shows another switching circuit architecture compensating the offset in the front end and eliminating the offset of the amplifier. The accurate measurement circuit comprises an amplifier 50 and four switches. The amplifier 50 generates an output signal according to the voltage of a positive input of amplifier 501. A first switch 401 is connected between a positive terminal pin 201 and the positive input of amplifier 501. A second switch 402 is connected between the positive terminal pin 201 and a reference voltage 30. A third switch 403 is connected between a negative terminal pin 202 and the positive input of amplifier 501. A fourth switch 404 is connected between the negative terminal pin 202 and the reference voltage 30. The positive terminal pin 201 and the negative terminal pin 202 are used to connect to the measurement terminal.

Figure 11B:
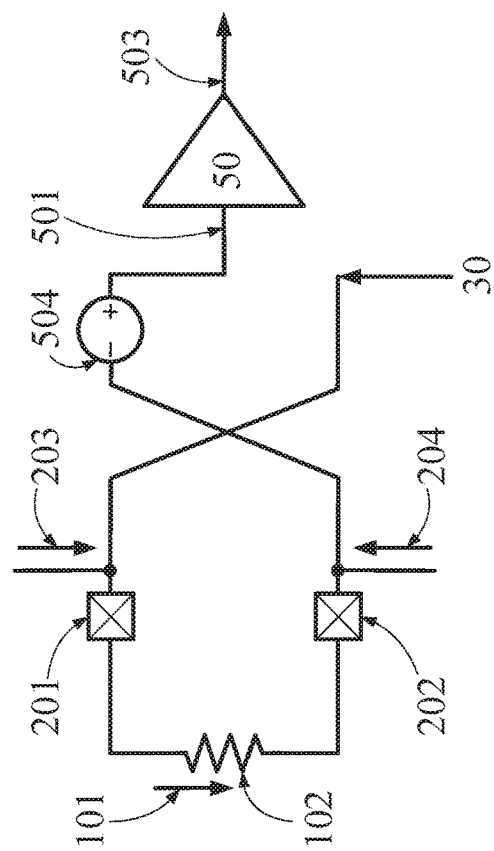
FIG. 11A and FIG. 11B illustrate an operation method for the switching circuit compensating the offset in the front end and in the amplifier in FIG. 10.
Figure 11A:
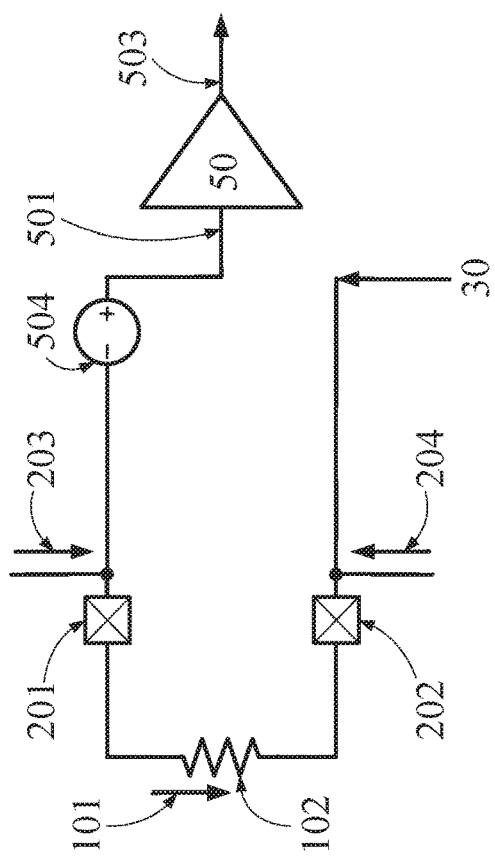

An operation method of above accurate measurement circuit comprises into two timings. In a first timing, conduct the first switch 401 and the fourth switch 404, and turn off the second switch 402 and the third switch 403. Hence, the positive terminal pin 201 is connected to the positive input of amplifier 501, and the negative terminal pin 202 is connected to the reference voltage 30 at the same time. An equivalent circuit diagram is shown in FIG. 11A. Thus, the voltage of the positive input of amplifier 501 is "$V_{REF}+V_{OS}-(I_S+I_{L1})*R_S$". In a second timing, conduct the second switch 402 and the third switch 403, and turn off the first switch 401 and the fourth switch 404. Hence, the positive terminal pin 201 is connected to the reference voltage 30, and the negative terminal pin 202 is connected to the positive input of amplifier 501 at the same time. An equivalent circuit diagram is shown in FIG. 11B. Thus, the voltage of the positive input of amplifier 501 is "$V_{REF}+V_{OS}-(I_S-I_{L2})*R_S$". Assuming the gain of the amplifier is K, an output voltage $V_{OUT1}$ output by the output of amplifier 503 in FIG. 11A is:

$$V_{OUT1} = K*(V_{IN})$$
$$= K*(V_{REF} + (I_S + I_{L1})*R_S)$$

An output voltage $V_{OUT2}$ output by the output of amplifier 503 in FIG. 11B is:

$$V_{OUT2} = K*(V_{IN})$$
$$= K*(V_{REF} - (I_S - I_{L2})*R_S)$$

Output voltages $V_{OUT1}$ and $V_{OUT2}$ generated in the two timings are subtracted and then divided by 2 to get "$K*(I_S+((I_{L1}-I_{L2})/2))*R_S$". Thus, non-ideal effect of the leakage current of positive terminal pin ($I_{L1}$) and the leakage current of negative terminal pin ($I_{L2}$) can be compensated. Meanwhile, errors of the offset voltage 504 ($V_{OS}$) of the amplifier can be eliminated.

Figure 9:
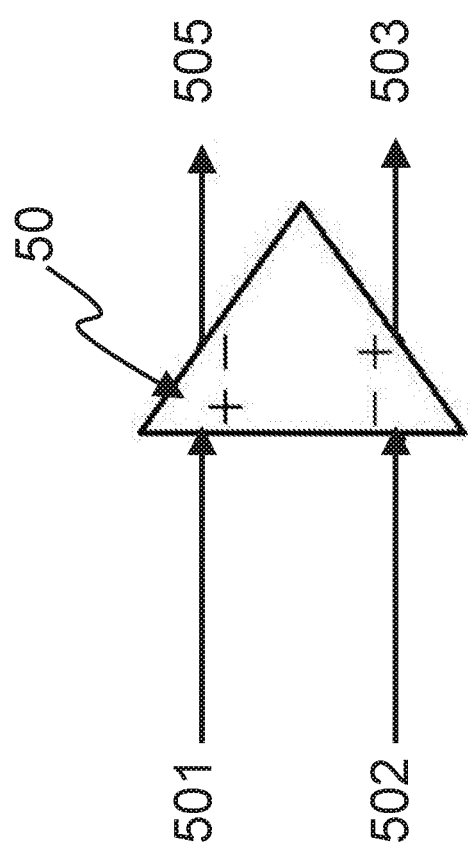
FIG. 9 illustrates another aspect of the amplifier according to the present invention.

According to the present invention, the voltage of output of amplifier 503 equals to a voltage difference between the positive input of amplifier 501 and the negative input of amplifier 502, and multiplied by a gain (K). Mathematical expression is "$V_{OUT+}=K*(V_{IN+}-V_{IN-})$". In addition, please refer to FIG. 9. The amplifier 50 can further comprises a negative output of amplifier 505. A voltage difference between the output of amplifier 503 and the negative output of amplifier 505 equals to a voltage difference between the positive input of amplifier 501 and the negative input of amplifier 502, multiplied by a gain (K). Mathematical expression is "$V_{OUT+}-V_{OUT-}=K*(V_{IN+}-V_{IN-})$".

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An accurate measurement circuit which compensates offset of a front end circuit while performing current measurement, comprising:
    a measurement terminal, having a positive terminal pin and a negative terminal pin, wherein an impedance is connected between the positive terminal pin and the negative terminal pin and a current flowing through the impedance is measured;
    an amplifier, having a positive input of amplifier connected to the measurement terminal via the positive terminal pin and a negative input of amplifier connected to the measurement terminal via the negative terminal pin, wherein an output signal is generated according to a voltage difference between the positive input of amplifier and the negative input of amplifier;
    a first switch, connected between the positive input of amplifier and a reference voltage; and
    a second switch, connected between the negative input of amplifier and the reference voltage.

2. The accurate measurement circuit according to claim 1, wherein the amplifier further comprises a negative output of amplifier; a voltage difference between the output of amplifier and the negative output of amplifier equals to a voltage difference between the positive input of amplifier and the negative input of amplifier multiplied by a gain.

3. The accurate measurement circuit according to claim 1, wherein a control method for the switches comprising:
    a first timing, conducting the first switch, and turning off the second switch; hence the positive input of amplifier is connected to the reference voltage; and
    a second timing, conducting the second switch, and turning off the first switch; hence the negative input of amplifier is connected to the reference voltage; wherein output voltages generated during the first timing and the second timing are added to compensate an offset of a front end circuit.

4. The accurate measurement circuit according to claim 3, wherein the amplifier further comprises a negative output of amplifier; a voltage difference between the output of amplifier and the negative output of amplifier equals to a voltage difference between the positive input of amplifier and the negative input of amplifier multiplied by a gain.

5. The accurate measurement circuit according to claim 3, wherein the higher input impedance of the measurement terminal is, the better the compensation effect for the offset of the front end circuit is.

6. The accurate measurement circuit according to claim 3, wherein the closer the current values of the leakage current of positive terminal pin and the leakage current of negative terminal pin are, the better the compensation effect is.

7. An accurate measurement circuit which compensates offset of a front end circuit while performing current measurement, comprising:
    a measurement terminal, having a positive terminal pin and a negative terminal pin, wherein an impedance is connected between the positive terminal pin and the negative terminal pin and a current flowing through the impedance is measured;
    an amplifier, generating an output signal according to a voltage difference between a positive input of amplifier and a negative input of amplifier;
    a first switch and a second switch, wherein one terminal of the first switch and one terminal of the second switch are both connected to a reference voltage, other terminals thereof are connected to the measurement terminal via the positive terminal pin and the negative terminal pin, respectively;
    a third switch, connected between the positive terminal pin and the positive input of amplifier;
    a fourth switch, connected between the positive terminal pin and the negative input of amplifier;
    a fifth switch, connected between the negative terminal pin and the positive input of amplifier; and
    a sixth switch, connected between the negative terminal pin and the negative input of amplifier.

8. The accurate measurement circuit according to claim 7, wherein the amplifier further comprises a negative output of amplifier; a voltage difference between the output of amplifier and the negative output of amplifier equals to a voltage difference between the positive input of amplifier and the negative input of amplifier multiplied by a gain.

9. The accurate measurement circuit according to claim 7, wherein a control method for the switches comprising:
    a first timing, conducting the first switch, the third switch and the sixth switch, and turning off the second switch, the fourth switch and the fifth switch; hence the positive terminal pin and the positive input of amplifier are connected to the reference voltage, and the negative terminal pin is connected to the negative input of amplifier at the same time; and
    a second timing, conducting the second switch, the fourth switch and the fifth switch, and turning off the first switch, the third switch and the sixth switch; hence the positive terminal pin is connected to the negative input of amplifier, and the negative terminal pin and the positive input of amplifier are connected to the reference voltage at the same time; wherein output voltages generated during the first timing and the second timing are subtracted to compensate offsets of a front end circuit and the amplifier at the same time.

10. The accurate measurement circuit according to claim 9, wherein the amplifier further comprises a negative output of amplifier; a voltage difference between the output of amplifier and the negative output of amplifier equals to a voltage difference between the positive input of amplifier and the negative input of amplifier multiplied by a gain.

11. The accurate measurement circuit according to claim 9, wherein the higher input impedance of the measurement terminal is, the better the compensation effect for the offset of the front end circuit is.

12. The accurate measurement circuit according to claim 9, wherein the closer the current values of the leakage current of positive terminal pin and the leakage current of negative terminal pin are, the better the compensation effect is.

13. An accurate measurement circuit which compensates offset of a front end circuit while performing current measurement, comprising:
    a measurement terminal, having a positive terminal pin and a negative terminal pin, wherein an impedance is connected between the positive terminal pin and the negative terminal pin and a current flowing through the impedance is measured;

an amplifier, generating an output signal according to a voltage difference between a positive input of amplifier and a negative input of amplifier;

a reference voltage, connected to the positive input of amplifier or the negative input of amplifier;

a first switch, connected between the positive terminal pin and the positive input of amplifier;

a second switch, connected between the positive terminal pin and the negative input of amplifier;

a third switch, connected between the negative terminal pin and the positive input of amplifier; and a fourth switch, connected between the negative terminal pin and the negative input of amplifier; wherein the positive terminal pin and the negative terminal pin are used to connect to the measurement terminal.

14. The accurate measurement circuit according to claim 13, wherein the amplifier further comprises a negative output of amplifier; a voltage difference between the output of amplifier and the negative output of amplifier equals to a voltage difference between the positive input of amplifier and the negative input of amplifier multiplied by a gain.

15. The accurate measurement circuit according to claim 13, wherein a control method for the switches comprising:
a first timing, conducting the first switch and the fourth switch, and turning off the second switch and the third switch; hence the positive terminal pin is connected to the positive input of amplifier, and the negative terminal pin is connected to the negative input of amplifier at the same time; and
a second timing, conducting the second switch and the third switch, and turning off the first switch and the fourth switch; hence the positive terminal pin is connected to the negative input of amplifier, and the negative terminal pin is connected to the positive input of amplifier at the same time; during the first timing and the second timing, the reference voltage is fixedly connected to the positive input of amplifier or the negative input of amplifier; wherein output voltages generated during the first timing and the second timing are subtracted to compensate offsets of a front end circuit and the amplifier at the same time.

16. The accurate measurement circuit according to claim 15, wherein the amplifier further comprises a negative output of amplifier; a voltage difference between the output of amplifier and the negative output of amplifier equals to a voltage difference between the positive input of amplifier and the negative input of amplifier multiplied by a gain.

17. The accurate measurement circuit according to claim 15, wherein the higher input impedance of the measurement terminal is, the better the compensation effect for the offset of the front end circuit is.

18. The accurate measurement circuit according to claim 15, wherein the closer the current values of the leakage current of positive terminal pin and the leakage current of negative terminal pin are, the better the compensation effect is.

19. An accurate measurement circuit which compensates offset of a front end circuit while performing current measurement, comprising:
a measurement terminal, having a positive terminal pin and a negative terminal pin, wherein an impedance is connected between the positive terminal pin and the negative terminal pin and a current flowing through the impedance is measured;
an amplifier, generating an output signal according to a voltage of a positive input of amplifier;
a first switch, connected between the positive terminal pin and the positive input of amplifier;
a second switch, connected between the positive terminal pin and a reference voltage;
a third switch, connected between the negative terminal pin and the positive input of amplifier; and
a fourth switch, connected between the negative terminal pin and the reference voltage; wherein the positive terminal pin and the negative terminal pin are used to connect to the measurement terminal.

20. The accurate measurement circuit according to claim 19, wherein a control method for the switches comprising:
a first timing, conducting the first switch and the fourth switch, and turning off the second switch and the third switch; hence the positive terminal pin is connected to the positive input of amplifier, and the negative terminal pin is connected to the reference voltage at the same time; and
a second timing, conducting the second switch and the third switch, and turning off the first switch and the fourth switch; hence the positive terminal pin is connected to the reference voltage, and the negative terminal pin is connected to the positive input of amplifier at the same time; wherein output voltages generated during the first timing and the second timing are subtracted to compensate offsets of a front end circuit and the amplifier at the same time.

21. The accurate measurement circuit according to claim 20, wherein the higher input impedance of the measurement terminal is, the better the compensation effect for the offset of the front end circuit is.

22. The accurate measurement circuit according to claim 20, wherein the closer the current values of the leakage current of positive terminal pin and the leakage current of negative terminal pin are, the better the compensation effect is.

* * * * *